(12) United States Patent
Ito

(10) Patent No.: US 7,659,765 B2
(45) Date of Patent: Feb. 9, 2010

(54) RESISTOR CIRCUIT

(75) Inventor: Koichi Ito, Tokyo (JP)

(73) Assignee: Sony Corporation, Tokyo (JP)

( * ) Notice: Subject to any disclaimer, the term of this patent is extended or adjusted under 35 U.S.C. 154(b) by 288 days.

(21) Appl. No.: 11/911,637

(22) PCT Filed: May 25, 2006

(86) PCT No.: PCT/JP2006/310432

§ 371 (c)(1),
(2), (4) Date: Oct. 15, 2007

(87) PCT Pub. No.: WO2006/132090

PCT Pub. Date: Dec. 14, 2006

(65) Prior Publication Data

US 2009/0284311 A1 Nov. 19, 2009

(30) Foreign Application Priority Data

Jun. 7, 2005 (JP) ............................ 2005-166465

(51) Int. Cl.
*H03L 5/00* (2006.01)
(52) U.S. Cl. ..................................... 327/308; 333/81 R
(58) Field of Classification Search .................. 327/308
See application file for complete search history.

(56) References Cited

U.S. PATENT DOCUMENTS 4,875,023 A * 10/1989 Maoz ....................... 333/81 R
4,975,604 A * 12/1990 Barta ......................... 327/308
5,087,899 A * 2/1992 Lauper ..................... 333/81 R
6,542,045 B2 * 4/2003 Nishibe .................... 333/81 R
7,310,001 B2 * 12/2007 Shigeta et al. .............. 324/769
2003/0076148 A1 4/2003 Tamiya et al.

FOREIGN PATENT DOCUMENTS

| JP | 4-213211 | 8/1992 |
| JP | 8-222994 | 8/1996 |
| JP | 9-069421 | 3/1997 |
| JP | 2003-204247 | 10/2007 |

OTHER PUBLICATIONS

International Search Report dated Aug. 7, 2006.

* cited by examiner

*Primary Examiner*—Kenneth B. Wells
(74) *Attorney, Agent, or Firm*—K&L Gates LLP

(57) ABSTRACT

Operations as a variable resistor are favorably realized even when a drain-source voltage of a variable MOS resistor and that of a reference MOS resistor are not the same. A gate voltage of the variable MOS resistor is controlled with reference to a gate voltage which is controlled such that a voltage generated in the reference MOS resistor is controlled to be the same as a reference voltage. A resistor is connected in parallel with the reference MOS resistor between the drain and source thereof, the resistor including a pair of resistors having the same resistance connected in series. Half of a drain-source voltage of the reference MOS resistor is detected at an intermediate point of the pair of resistors. The gate voltage of the variable resistor is obtained by subtracting one-half of the drain-source voltage from the gate voltage of the reference MOS resistor.

9 Claims, 5 Drawing Sheets

RESISTOR CIRCUIT

CROSS REFERENCE TO RELATED APPLICATIONS

The present application claims priority to Japanese Patent Document Nos. P2005-166465 filed on Jun. 7, 2005, the disclosure of which is herein incorporated by reference.

BACKGROUND

The present invention relates to a resistor circuit for controlling the resistance to be desirable, and more particularly to a resistor circuit for variably controlling a MOS resistor by controlling the gate voltage of a MOS transistor.

In more detail, the present invention relates to a resistor circuit in which a reference resistor circuit employing a MOS resistor is disposed, which controls the gate voltage of a MOS such that a voltage generated in the reference resistor circuit is controlled to be the same as a reference voltage (that is, a resistance of the reference resistor circuit is controlled to be constant), and controls the gate voltage of a MOS in a variable resistor circuit including a MOS resistor with reference to the gate voltage of the MOS in the reference resistor circuit in order to follow the resistance of the MOS resistor in the reference resistor circuit. In particular, the present invention relates to a resistor circuit for realizing operations for allowing a variable MOS resistor to follow a reference MOS resistor in terms of the resistance even in the case where the drain-source voltage of the variable MOS resistor and that of the reference MOS resistor are not the same.

A large number of transistor elements having functions including switching, oscillating, amplifying, and the like are implemented in a semiconductor integrated circuit (IC). A transistor with a MOS structure which has three layers including a metal layer, a silicon oxide film layer, and a silicon semiconductor layer may be indicated as a representative example of field-effect transistors (FETs). A MOSFET employing an n-type semiconductor substrate is called a PMOS. A MOSFET employing a p-type semiconductor substrate is called an nMOS.

A field-effect transistor has three electrodes including the source, the drain, and the gate. A MOS transistor has current-voltage characteristics in which a channel is generated on a substrate surface between the source region and the drain region, and a drain current $I_d$ flows if a gate voltage $V_{gs}$ is increased to be greater than or equal to a threshold voltage $V_{th}$ in a state where the source electrode and a substrate electrode are grounded and a constant voltage $V_{ds}$ is applied to the drain electrode. The MOS transistor can be treated as a resistor unit having a MOS resistor $R=V_{ds}/I_d$ by utilizing such characteristics.

Here, the drain current $I_d$ and the drain-source voltage $V_{ds}$ at a triode region of the MOS are expressed by Eq. (1) given below (for example, see Non-Patent Document 1).

$$I_d = \mu C_{OX} \frac{W}{L}\left[(V_{gs} - V_{th})V_{ds} - \frac{1}{2}V_{ds}^2\right] \quad (1)$$

Here, if the drain-source voltage $V_{ds}$ is sufficiently small and $V_{ds} \ll 2(V_{gs}-V_{th})$ is assumed, the drain current $I_d$ can be approximated by using Expression (2) given below.

$$I_d \approx \mu C_{OX} \frac{W}{L}(V_{gs} - V_{th})V_{ds} \quad (2)$$

Therefore, the MOS resistor $R=V_{ds}/I_d$ at the triode region is expressed by Eq. (3) given below with the use of the approximate expression. The MOS resistor R in this case does not depend on the drain-source voltage $V_{ds}$, and the resistance can be controlled by the gate voltage $V_{gs}$.

$$R = \frac{V_{ds}}{I_d} = \frac{1}{\mu C_{OX} \frac{W}{L}(V_{gs} - V_{th})} \quad (3)$$

In contrast, if the condition $V_{ds} \ll 2(V_{gs}-V_{th})$ is not satisfied, the MOS resistor R depends on the drain-source voltage $V_{ds}$, and thereby the MOS resistor R is expressed by Eq. (4) given below. In this case, only the gate voltage $V_{gs}$ can no longer control the MOS resistor.

$$R = \frac{V_{ds}}{I_d} = \frac{1}{\mu C_{OX} \frac{W}{L}\left(V_{gs} - V_{th} - \frac{1}{2}V_{ds}\right)} \quad (4)$$

Here, it is necessary that the drain-source voltage $V_{ds}$ decrease or the gate voltage $V_{gs}$ increase in order to satisfy the approximate condition $V_{ds} \ll 2(V_{gs}-V_{th})$ for MOS resistors. It is necessary that the resistance decrease or a current of the resistor circuit decrease in order to decrease the drain-source voltage $V_{ds}$; however, disadvantages occur in terms of resistance-precision. Moreover, if the gate voltage $V_{gs}$ is maintained large, it is difficult to realize a variable resistance which can be varied over a wide range since the gate voltage $V_{gs}$ cannot be changed by a large amount. Therefore, the use of MOS resistors according to the approximate expression given by Eq. (3) has technical problems.

In addition, MOS resistors have other technical problems of element-to-element variation and sensitiveness to temperature. Thus, the following design method is widely employed. The method includes disposing a reference resistor circuit which employs a MOS resistor, controlling the gate voltage of a MOS such that a voltage generated in the reference resistor circuit is controlled to be the same as a reference voltage, that is, the resistance of the reference resistor circuit is controlled to be constant, and controlling the gate voltage of a MOS in a variable resistor circuit including a MOS resistor with reference to the gate voltage of the MOS in the reference resistor circuit.

For example, a variable resistor circuit described in Patent Document 1 is configured such that each of the MOS resistors is controlled to have the same resistance by providing the gate voltage of a transistor M1 serving as a variable MOS resistor to a transistor M2 serving as a reference MOS resistor. In the variable resistor circuit, the drain-source voltage generated in the transistor 2 serving as the reference MOS resistor is input to a positive terminal of an OP amplifier 7, and the voltage applied to a resistor $R_e$ is input to a negative terminal thereof. The gate voltage of the transistor M2 is controlled such that no potential difference between these voltages exists, and thereby the resistance of the reference MOS resistor is controlled to be the same as $R_e$ (for example, see FIG. 1 of Patent Document 1).

In the variable resistor circuit including such a reference MOS resistor and a variable MOS resistor, it is necessary to detect the potential $V_{ds}$ between the drain and source of the reference MOS resistor by causing a drain-source current $I_d$ to flow since it is necessary to control the resistance of the reference MOS resistor.

However, if $V_{ds}$ becomes large due to supply of the drain-source current $I_d$, the approximate expression such as Expression (2) no longer holds. Therefore, Eq. (3) cannot be satisfied. In this case, MOS resistors become affected by the drain-source voltage $V_{ds}$; however, the same drain-source voltage is not generated at the reference MOS resistor and the variable MOS resistor on every occasion. Thus, the variable MOS resistor is not guaranteed to have the same resistance as that of the reference MOS resistor even if the same gate voltage as that of the reference MOS resistor is applied to the variable MOS resistor. That is, desired operational characteristics cannot be obtained for the variable resistor circuit.

In addition, it is necessary that the drain-source voltage $V_{ds}$ of both of the MOS resistors be the same in order to improve resistance-following capability for the variable MOS resistor against the reference MOS resistor. In this case, it is necessary to cause a current to flow through the variable MOS resistor; however, there are disadvantages in terms of distortion, power consumption, and an output voltage in a low-voltage operation. Moreover, in the case where, for example, the resistor is employed as a load of a differential amplifier, it is often desired that no potential for the drain-source voltage $V_{ds}$ exist in the variable MOS resistor.

[Patent document 1]
Japanese Unexamined Patent Application Publication No. 2003-204247, FIG. 1.

[Non-Patent Document 1]
Behzad Razavi, "Analog CMOS Shuseki-kairo no Sekkei Kiso-hen".

SUMMARY

An object of the present invention is to provide a superior resistor circuit which can variably control a MOS resistor favorably by controlling the gate voltage of a MOS transistor.

Another object of the present invention is to provide a superior resistor circuit in which a reference resistor circuit employing a MOS resistor is disposed, which can control the gate voltage of a MOS such that a voltage generated in the reference resistor circuit is controlled to be the same as a reference voltage (that is, a resistance of the reference resistor circuit is controlled to be constant), and can control the gate voltage of a MOS in a variable resistor circuit including a MOS resistor favorably with reference to the gate voltage of the MOS in the reference resistor circuit.

Another object of the present invention is to provide a superior resistor circuit which can favorably realize, in a variable MOS resistor, an operation of following a resistance of a reference MOS resistor even when the variable MOS resistor and the reference MOS resistor do not have the same drain-source voltage.

The present invention has been made in view of the above-mentioned problems, and provides a resistor circuit including a reference MOS resistor, a variable MOS resistor, first control means for controlling a gate voltage of the reference MOS resistor such that a resistance of the reference MOS resistor is controlled to be constant, voltage detection means for detecting half of a drain-source voltage of the reference MOS resistor, and second control means for controlling the variable resistor by supplying a voltage as a gate voltage of the variable MOS resistor, the voltage being obtained by subtracting half the drain-source voltage of the reference MOS resistor detected by the voltage detection means from the gate voltage of the reference MOS resistor controlled by the first control means.

The present invention relates to a variable resistor circuit employing MOS resistors. In particular, the variable resistor circuit may be configured to control a gate voltage of the reference MOS resistor such that a voltage generated at the reference MOS resistor is controlled to be the same as a reference voltage (that is, a resistance of the reference MOS resistor is controlled to be constant) and control a gate voltage of a variable MOS resistor with reference to the gate voltage of the reference MOS resistor. The reference MOS resistor and the variable MOS resistor may be of a pMOS type or an nMOS type.

Here, if $V_{ds}$ becomes large due to supply of a drain-source current $I_d$, the approximate expression (described above) for a MOS resistor R no longer holds and the MOS resistor becomes affected by the drain-source voltage $V_{ds}$. In this case, there is a problem that the reference MOS resistor and the variable MOS resistor are not guaranteed to have the same resistance even if the same gate voltage as that of the reference MOS resistor is applied to the variable MOS resistor since the same drain-source voltage is not generated at the reference MOS resistor and the variable MOS resistor on every occasion.

Thus, the resistor circuit according to the present invention is designed to detect half the drain-source voltage of the reference MOS resistor while the gate voltage of the reference MOS resistor is controlled such that the resistance of the reference MOS resistor is controlled to be constant, and to control the variable resistor by supplying the voltage obtained by subtracting half the drain-source voltage of the reference MOS resistor from the gate voltage of the reference MOS resistor. Here, the obtained voltage serves as the gate voltage of the variable MOS resistor.

This allows the resistor circuit according to the present invention to control the variable MOS resistor without constraints related to the approximate condition $V_{ds} \ll 2(V_{gs} - V_{th})$ for MOS resistors. In addition, it is not necessary any more that the variable MOS resistor and the reference MOS resistor are controlled to have the same drain-source voltage.

Here, the first control means may include means for detecting a voltage generated in the reference MOS resistor and means for controlling the voltage generated in the reference MOS resistor to be the same as a predetermined reference voltage.

The voltage detection means may include a resistor unit connected in parallel with the reference MOS resistor between a drain and source thereof, the resistor unit having two resistors with the same resistance connected in series. Therefore, half the drain-source voltage of the reference MOS resistor can be detected at an intermediate point of the resistor unit having the resistors connected in series.

In the circuit configuration described above, the drain-source voltage of the variable MOS resistor is assumed to be 0 V. As a matter of course, the resistance-following capability can be similarly realized even when there is a potential difference between the drain and source of the variable MOS resistor. In this case, the resistor circuit may further include second voltage detection means for detecting half of the drain-source voltage of the variable MOS resistor. The second control means supplies a voltage, which serves as the gate voltage of the variable MOS resistor P, obtained by subtracting half the drain-source voltage of the reference MOS resistor from and adding half the drain-source voltage of the variable MOS resistor to the gate voltage of the reference MOS resistor, and thereby controls the resistance.

The resistor circuit according to the present invention can be employed to configure, for example, a load circuit. A differential amplifier circuit can be realized by inserting such a load circuit serving as an output load between output terminals. Moreover, such a load circuit can be implemented as a load resistor within a transmission amplifier or a reception amplifier in a communication apparatus.

ADVANTAGES

The present invention provides a superior resistor circuit in which a reference resistor circuit employing a MOS resistor is disposed, which can control a gate voltage of a MOS such that a voltage generated in the reference resistor circuit is controlled to be the same as the reference voltage (that is, a resistance of the reference resistor circuit is controlled to be constant), and can control the gate voltage of a MOS in a variable resistor circuit including a MOS resistor favorably with reference to the gate voltage of the MOS in the reference resistor circuit.

A resistor circuit according to the present invention can realize operations as a variable resistor if constraints related to the approximate condition $V_{ds} \ll 2(V_{gs}-V_{th})$ for MOS resistors do not exist and a MOS performs within a triode region.

A resistor circuit according to the present invention can improve precision thereof by increasing a drain-source voltage $V_{ds}$ of the reference MOS resistor since constraints related to the approximate condition $V_{ds} \ll 2(V_{gs}-V_{th})$ for MOS resistors do not exist. The increase in the drain-source voltage $V_{ds}$ can decrease a current from a constant current source which supplies a drain current $I_d$ to MOS resistors, and reduce power consumption. Moreover, a variable resistance which can be varied over a wide range can be realized since a gate voltage $V_{gs}$ can be changed by a large amount.

A resistor circuit according to the present invention is usable even when a DC voltage of the ends of a variable MOS resistor is 0 V since it is not necessary that the variable MOS resistor and a reference MOS resistor have the same drain-source voltage $V_{ds}$, and thus can be used as a load of a differential amplifier. Furthermore, a resistance of the variable MOS resistor can be generated to be lower than that of the reference MOS resistor with low power consumption.

Other objects, characteristics, and advantages of the present invention will be apparent from the detailed description based on the following embodiments of the present invention and attached drawings.

Additional features and advantages of the present invention are described in, and will be apparent from, the following Detailed Description and the Figures.

Figure 1:
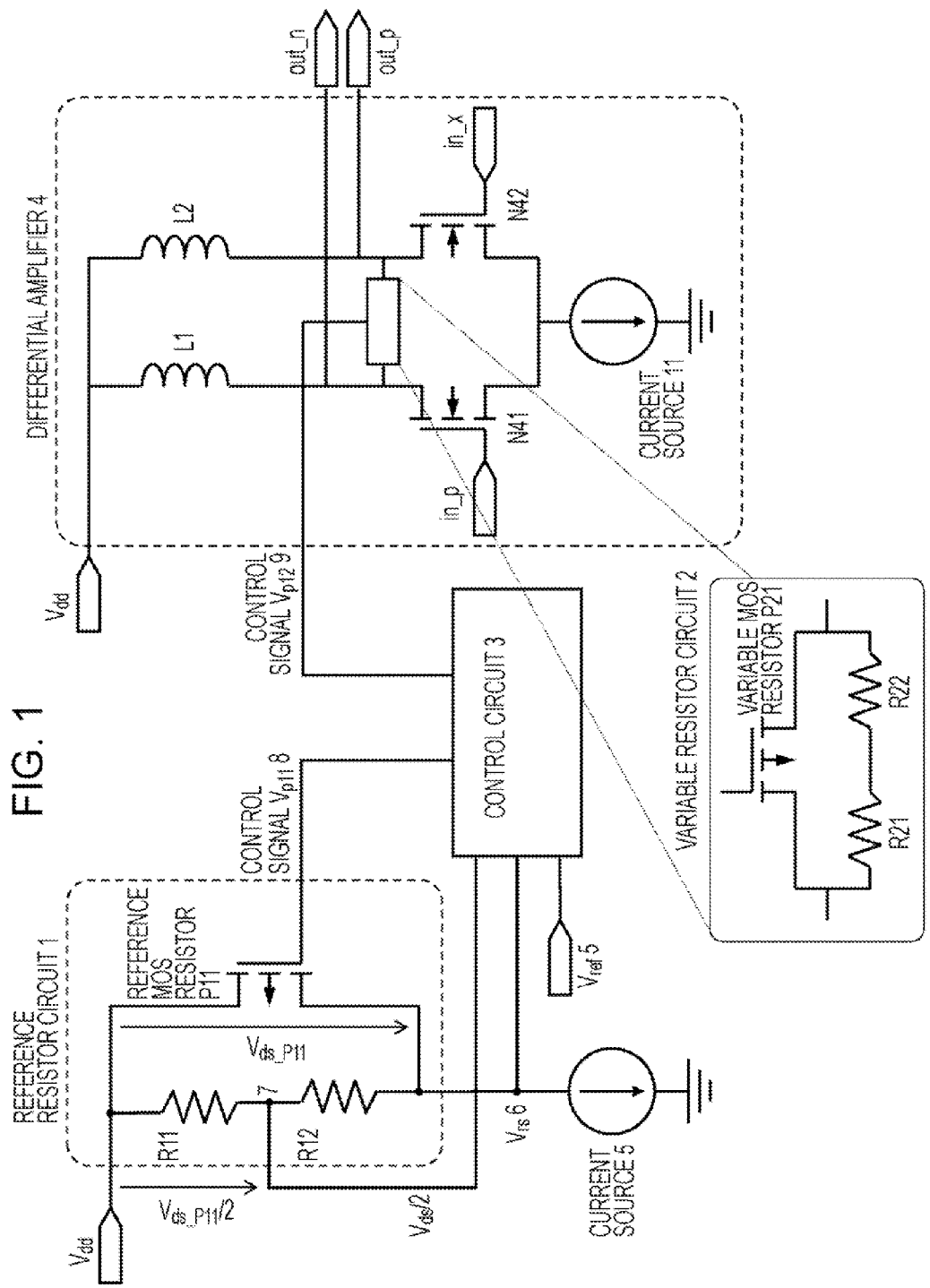
FIG. 1 is a diagram showing a structure of a resistor circuit according to an embodiment of the present invention.

REFERENCE NUMERALS 1 reference resistor circuit
2 variable resistor circuit
3 control circuit
4 differential amplifier
5, 11 constant current source
31, 32 variable voltage source
34, 35 operational amplifier
37 subtractor
101 antenna
102 antenna switch
103 reception amplifier
104 demodulator
105 signal processor
106 modulator
107 transmission amplifier
108 local oscillator

DETAILED DESCRIPTION

Embodiments of the present invention will be described below with reference to the drawings.

The present invention relates to a variable resistor circuit employing a MOS resistor. In particular, a gate voltage of a reference MOS resistor is controlled such that a voltage generated at the reference MOS resistor is controlled to be the same as a reference voltage (that is, a resistance of the reference MOS resistor is controlled to be constant), and a gate voltage of a variable MOS resistor is controlled with reference to the gate voltage of the reference MOS resistor.

If $V_{ds}$ becomes large due to supply of a drain-source current $I_d$, the approximate expression (described above) for MOS resistors no longer holds and MOS resistors become affected by the drain-source voltage $V_{ds}$. Thus, there is a problem that, in a resistor circuit employing MOS resistors, a resistance of a variable MOS resistor and that of a reference MOS resistor are not guaranteed to be the same even if the same gate voltage is added to the variable MOS resistor and the reference MOS resistor. This is because the same drain-source voltage is not generated at the reference MOS resistor and at the variable MOS resistor on every occasion.

In contrast, a resistor circuit according to the present invention is designed to detect half the drain-source voltage of the reference MOS resistor, subtract half the drain-source voltage from the gate voltage of the reference MOS resistor, provide the resulting voltage as a gate voltage of the variable MOS resistor, and control the variable resistor while the gate voltage of the reference MOS resistor is controlled such that a resistance of the reference MOS resistor is controlled to be constant.

In the resistor circuit according to the present invention, the variable MOS resistor can be controlled without constraints related to the approximate condition $V_{ds} \ll 2(V_{gs}-V_{th})$ for MOS resistors, and furthermore, it is not necessary for drain-source voltages of the variable MOS resistor and the reference MOS resistor to be the same. This will be described below.

FIG. 1 shows a structure of a resistor circuit according to one embodiment of the present invention. The shown resistor circuit includes a reference resistor circuit 1 having a reference MOS resistor P11, a variable resistor circuit 2 having a variable MOS resistor P21, a control circuit 3 controlling a gate voltage of each of the MOS resistors P11 and P21, a current source 5 for the reference resistor circuit 1, and a current source 11 for the variable resistor circuit 2. FIG. 1 shows the structure in which the variable-resistor control circuit 3 and the controlled variable resistor circuit 2 are connected to a differential amplifier 4.

A gate voltage $V_{gs\_p11}$ of the reference MOS resistor P11 in the reference resistor circuit 1 is controlled by the control circuit 3 such that the generated voltage is controlled to be the same as a predetermined reference voltage $V_{ref}$, that is, a resistance of the reference MOS resistor P11 is controlled to be constant. A resistor unit having two identical resistors R11 and R12 connected in series is connected in parallel with the reference MOS resistor P11 between the drain and source thereof. An electric potential that is half the drain-source voltage $V_{ds\_p11}$ of the reference MOS resistor P11 can be obtained from the intermediate point between the resistors R11 and R12 connected in series.

The variable resistor circuit 2 has a structure similar to that of the reference resistor circuit 1. A resistor unit having two identical resistors R21 and R22 connected in series is connected in parallel with the variable MOS resistor P21 between the drain and source thereof. In an example shown in FIG. 1, the variable resistor circuit 2 works as an output load by being inserted between outputs out_p and out_n of the differential amplifier 4. The outputs out_p and out_n of the differential amplifier 4 are connected via choke coils L1 and L2, respectively, to a power supply $V_{dd}$, and thus ends of the variable resistor circuit 2 are controlled to be at the same potential in a direct current (DC) manner.

A voltage $V_r$, a voltage $V_{ds}/2$, and the reference voltage $V_{ref}$ are input to the control circuit 3. The voltage $V_r$ is a voltage obtained at a detection point denoted by reference numeral 6, the voltage being generated at the MOS resistor P11 in the reference resistor circuit 1. The voltage $V_{ds}/2$ is a voltage obtained from the intermediate point 7, which is denoted by reference numeral 7, between the resistors R11 and R12 connected in series, the voltage being half the drain-source voltage $V_{ds\_p11}$. The reference voltage $V_{ref}$ is denoted by reference numeral 5. The control circuit 3 produces control signals 8 and 9 used for controlling the reference resistor circuit 1 and the variable resistor circuit 2, respectively. The potential of the control signal 8 is shown as $V_{p11}$, and is input as the gate voltage $V_{gs\_p11}$ of the reference MOS resistor P11. The potential of the control signal 9 is shown as $V_{p21}$, and input as the gate voltage $V_{gs\_p21}$ of the variable MOS resistor P21.

The control circuit 3 is designed to control the gate voltage $V_{gs\_p11}$ such that the voltage $V_r$ generated at the reference MOS resistor P11 in the reference resistor circuit 1 is controlled to be the same as the reference voltage $V_{ref}$ (that is, the resistance of the reference MOS resistor P11 is controlled to be constant). The control circuit 3 is also designed to control the gate voltage $V_{gs\_p21}$ of the variable MOS resistor P21 in the variable resistor circuit 2 with reference to the gate voltage $V_{gs\_p11}$ of the reference MOS resistor P11. In particular, half the drain-source voltage $V_{ds\_p11}$ of the reference MOS resistor P11 is detected and subtracted from the gate voltage $V_{gs\_p11}$ of the reference MOS resistor P11, the resulting voltage is provided as the gate voltage $V_{gs\_p21}$ of the variable MOS resistor P21, and the resistance of the variable MOS resistor P21 is thereby controlled.

Figure 2:
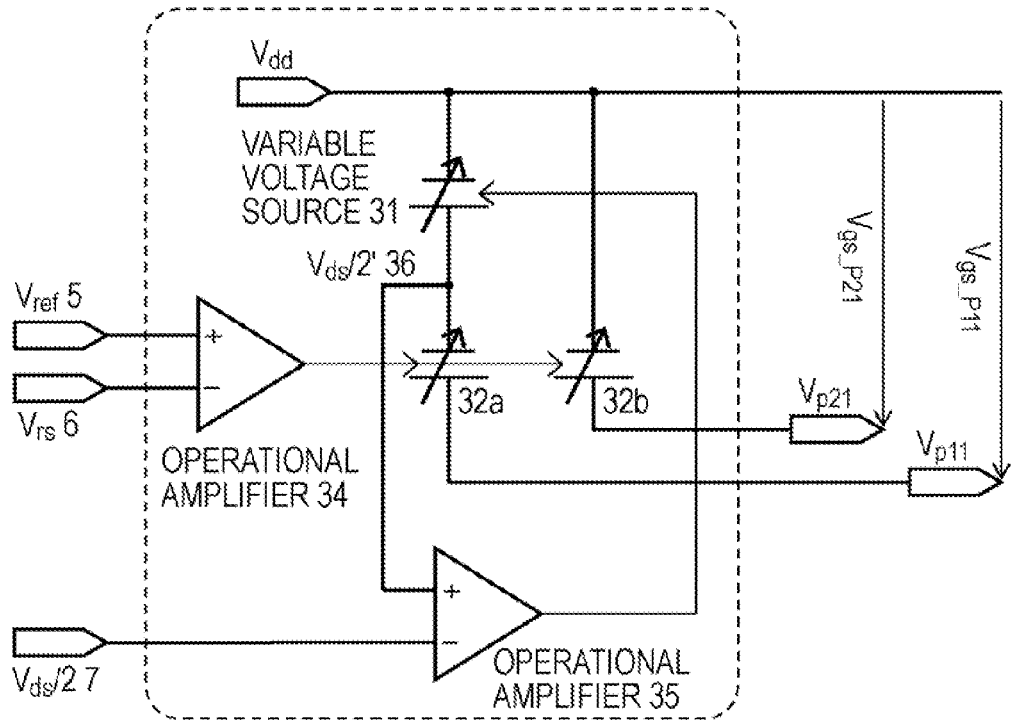
FIG. 2 is a block diagram showing an internal structure of a control circuit 3.

FIG. 2 shows an internal structure of the control circuit 3. The voltage $V_r$ generated at the reference MOS resistor P11 in the reference resistor circuit 1 is compared with the reference voltage $V_{ref}$ at an operational amplifier 34. The comparison result serves as a signal for controlling variable voltage sources 32a and 32b. The variable voltage sources 32a and 32b are identical variable voltage sources, and the same potential is generated across the ends of each of the voltage sources 32a and 32b. A voltage $V_{ds}/2'$ generated at the variable voltage source 32 is obtained from a detection point denoted by reference numeral 36. The voltage $V_{ds}/2'$ and the voltage $V_{ds}/2$ are input to an operational amplifier 35, the voltage $V_{ds}/2$ being obtained from the intermediate point 7 between the resistors R11 and R12 connected in series. A comparison result from the operational amplifier 35 serves as a signal for controlling a variable voltage source 31.

The control circuit 3 includes two output channels, one for the control signal 8 for the reference resistor circuit 1 and another for the control signal 9 for the variable resistor circuit 2. The potential $V_{p11}$ of the control signal 8 applied to the reference resistor circuit 1 is the sum of the potentials of the variable voltage source 31 and the variable voltage source 32a, and controls the gate voltage $V_{gs\_p11}$ of the reference MOS resistor P11 such that the voltage $V_{ds\_p11}$ generated in the reference resistor circuit 1 is controlled to be the same as the reference voltage (that is, the resistance of the reference resistor circuit 1 is controlled to be constant). The potential $V_{p21}$ of the control signal 9 applied to the variable resistor circuit 2 is a voltage of the variable voltage source 32b. The potential $V_{p21}$ is a voltage obtained by subtracting half the drain-source voltage $V_{ds\_p11}$ from the gate voltage $V_{gs\_p11}$ of the reference MOS resistor P11 and controls the gate voltage $V_{gs\_p21}$ of the variable MOS resistor P21.

Next, operations occurring in the resistor circuit shown in FIGS. 1 and 2 will be described.

A constant current I flows from the constant current source 5 to the reference resistor circuit 1. Here, the potential $V_r$ generated in the reference resistor circuit 1 is detected at the detection point 6 and input to the control circuit 3. Moreover, the reference voltage $V_{ref}$ denoted by reference numeral 5 is also input to the control circuit 3.

The control circuit 3 controls the gate voltage $V_{gs\_p11}$ of the reference MOS resistor P11 in the reference resistor circuit 1 using the potential $V_{p11}$ of the control signal 8 such that the voltage $V_r$ generated in the reference resistor circuit 1 is controlled to be the same as the reference voltage $V_{ref}$, thereby changing the resistance $R_{P11}$ of the reference MOS resistor P11. If the constant current source or the reference voltage is assumed to not vary due to process spread or sensitiveness to temperature, the resistance of the reference resistor circuit 1 is constant on every occasion. The resistance is $V_r/I$ with reference to $V_{dd}$.

In addition, the control circuit 3 controls the gate voltage $V_{gs\_p21}$ of the variable MOS resistor P21 in the variable resistor circuit 2 using the potential $V_{p21}$ of the control signal 9, thereby changing a resistance $R_{P21}$ thereof. The resistance $R_{P21}$ is controlled so as to follow the resistance $R_{p11}$, of the reference MOS resistor P11 by the control circuit 3.

Here, the potential $V_{p11}$ of the control signal 8 and the potential $V_{p21}$ of the control signal 9 will be described. The potential $V_{p11}$ corresponds to the gate voltage $V_{gs\_p11}$ of the reference MOS resistor P11. If the approximate expression $V_{ds} \ll 2(V_{gs}-V_{th})$ for resistors is not sufficiently satisfied at the reference MOS resistor P11, Eq. (5) given below is obtained for the gate voltage $V_{gs\_p11}$ on the basis of Eq. (4).

$$V_{gs\_p11} = \frac{1}{R_{P11}} \frac{1}{\mu C_{OX} \frac{W}{L}} + V_{th} + \frac{1}{2} V_{ds\_p11} \qquad (5)$$

Eq. (5) shows that the gate voltage $V_{gs\_p11}$ as the potential $V_{p11}$ of the control signal 8 for resistor-adjustment depends on the drain-source voltage $V_{ds\_p11}$.

The following focuses on the variable resistor circuit 2. In the case where the resistance $R_{P21}$ of the variable MOS resistor P21 is synchronized with the resistance $R_{p11}$ of the reference MOS resistor P11 so as to be the same, it is necessary for the drain-source voltage $V_{ds\_p11}$ of the reference MOS resistor P11 to be the same as the drain-source voltage $V_{ds\_p21}$ of the variable MOS resistor, otherwise the resistance cannot be copied precisely.

However, if the variable resistor circuit 2 is operated as a load for the differential amplifier 4 as shown in FIG. 1, the same potential is not supplied to the reference resistor circuit 1 and the variable resistor circuit 2. If the same potential is supplied to the variable resistor circuit, it negatively affects current consumption. Furthermore, power supply for the amplifier decreases, thereby affecting gain and distortion negatively.

Here, if a potential between the drain and source of the variable MOS resistor P21 is assumed to be 0 V, it is merely necessary that the potential of the gate voltage $V_{gs\_p21}$ shown in Eq. (6) be the control signal 9 to be supplied to the variable MOS resistor P21 in order that the variable MOS resistor P21 is controlled to have the same resistance as the reference MOS resistor P11.

$$V_{gs\_p21} = \frac{1}{R_{P21}} \frac{1}{\mu C_{OX} \frac{W}{L}} + V_{th} \quad (6)$$

Eq. (6) is obtained by subtracting half the drain-source voltage $V_{ds\_p11}$ of the reference MOS resistor P11, which is the third term of the right hand side of Eq. (5), from the gate voltage $V_{gs\_p11}$ of the reference MOS resistor P11 shown in Eq. (5). No term relating to the drain-source voltage $V_{ds\_p11}$ exists in Eq. (6). This means that it is not necessary for the drain-source voltage of the reference MOS resistor P11 and that of the variable MOS resistor P21 to be the same when the gate voltage $V_{gs\_p21}$ of the variable MOS resistor P12 is controlled with reference to the gate voltage $V_{gs\_p11}$ of the reference MOS resistor P11.

In addition, since constraints related to approximate condition $V_{ds} \ll 2(V_{gs} - V_{th})$ for MOS resistors do not exist for the reference MOS resistor P11, the drain-source voltage $V_{ds\_p11}$ can be increased and the precision can be improved. A current from the constant current source which supplies the drain current $I_d$ to the MOS resistor can be decreased by increasing the drain-source voltage $V_{ds\_p11}$, and thereby power consumption can be reduced. Furthermore, since the gate voltage $V_{gs}$ can be changed by a large amount, a variable resistance which can be varied over a wide range can be achieved.

The control circuit 3 shown in FIG. 2 has a structure which generates the gate voltage $V_{gs\_p11}$ for the reference MOS resistor P11 and the gate voltage $V_{gs\_p21}$ for the variable MOS resistor P21.

The voltage $V_r$ generated at the reference resistor circuit 1 and obtained from the detection point 6 and the reference voltage $V_{ref}$ denoted by reference numeral 5 are each input to the operational amplifier 34. The operational amplifier 34 controls the variable voltage sources 32a and 32b such that the generated voltage $V_r$ and the reference voltage $V_{ref}$ are controlled to be the same potential.

The drain-source voltage $V_{ds\_p11}$ is halved at the intermediate point 7 between the resistors R11 and R12 which are connected in parallel with the reference MOS resistor P11, and $V_{ds\_p11}/2$ is input to one of input terminals of the operational amplifier 35. Moreover, a voltage $V_{ds\_p11}/2'$ that is generated at the variable voltage source 31 is obtained from a detection point 36, and input to the other one of the input terminals of the operational amplifier 36. The operational amplifier 35 controls the variable voltage source 31 such that $V_{ds\_p11}/2'$ and $V_{ds\_p11}/2$ are controlled to be the same potential.

Here, the gate voltage $V_{gs\_p11}$ of the reference MOS resistor P11 is the sum of the potentials output from two variable voltage sources 31 and 32a, and is expressed by Eq. (5). If the voltages of the variable voltage sources 31 and 32a are shown as $V_{31}$ and $V_{32a}$, respectively, the power supply voltages $V_{31}$ and $V_{32a}$ are expressed by Eq. (7) and Eg. (8) given below, respectively, since the variable voltage source 31 is controlled to have $V_{ds}/2$ and the variable voltage source 32a is controlled such that $V_{gs\_p11}$ is equal to Eq. (5)

$$V_{31} = \frac{1}{2} V_{ds\_p11} \quad (7)$$

$$V_{32a} = V_{gs\_p21} = V_{gs\_p11} - V_{31} = \frac{1}{R_{P21}} \frac{1}{\mu C_{OX} \frac{W}{L}} + V_{th} \quad (8)$$

The variable voltage sources 32a and 32b are identical variable voltage sources, and the same potential is generated across the ends of each of the variable voltage sources 32a and 32b. Therefore, the output voltage $V_{gs\_p21}$ is similar to that expressed by Eq. (6), and the control signal for the variable MOS resistor P21 can be generated. Such a circuit configuration allows the resistance of the variable MOS resistor P21 to follow the resistance of the reference MOS resistor P11 for any given drain-source voltage $V_{ds\_p11}$ of the variable MOS resistor P21.

Note that the variable MOS resistor P21 is of a PMOS type in the circuit configuration shown in FIG. 1; however, it can be of an nMOS type instead. In this case, a variable MOS resistor of an nMOS type can be realized by setting the power source voltage $V_{dd}$ connected to source to be GND.

Figure 3:
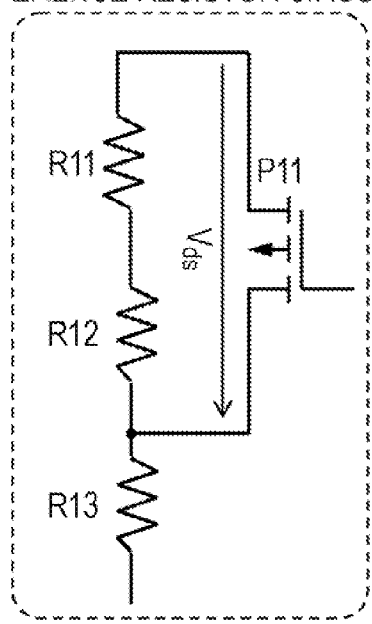
FIG. 3 is a diagram showing an exemplary application of a reference resistor circuit 1.

Moreover, FIG. 3 shows an exemplary application of the reference resistor circuit 1. In the example shown in FIG. 3, the resistor unit including the two identical resistors R11 and R12 connected in series is connected in parallel with the reference MOS resistor P11 between the drain and source thereof. Moreover, a resistor R13 is connected in series with the resistors R11 and R12 so as to be adjacent to the source of the reference MOS resistor P11. This can further increase the resistance of the reference resistor circuit 1. The variable resistor circuit 2 can employ a structure similar to that of the reference resistor circuit 1.

Figure 4:
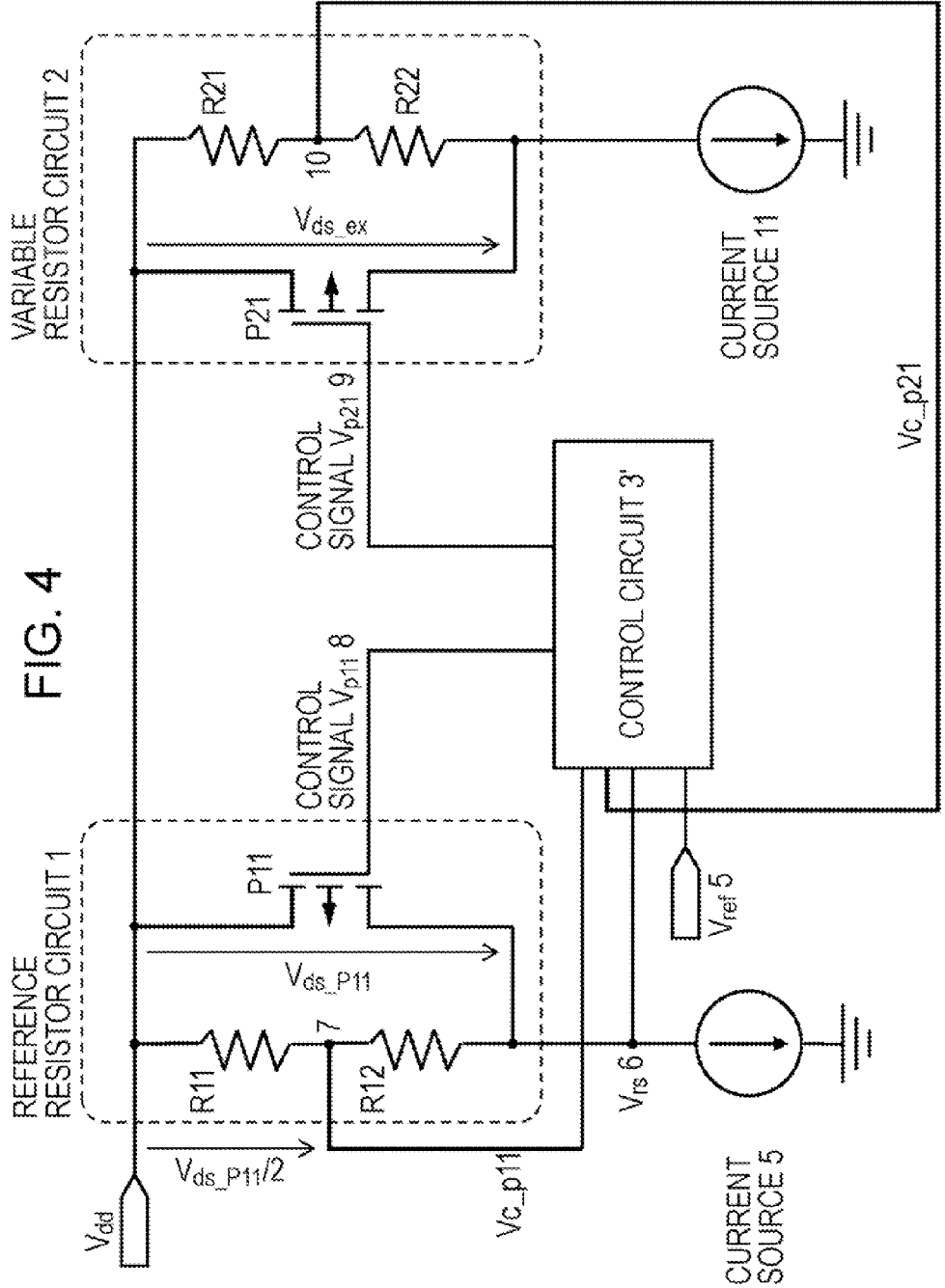
FIG. 4 is a diagram showing an exemplary structure of a resistor circuit if a drain-source voltage Vds_p21 of a variable MOS resistor P21 is assumed to exist.

In the embodiment shown in FIG. 1, the drain-source voltage $V_{ds\_p21}$ of the variable MOS resistor P21 is assumed to be 0 V; however, as a matter of course, even when a potential difference exists between the drain and source, the resistance-following capability can be similarly achieved. FIG. 4 shows an exemplary configuration of a resistor circuit including means which achieves favorable resistance-following capability for the variable MOS resistor P21 against the reference MOS resistor P11 in the case where the drain-source voltage $V_{ds\_p21}$ of the variable MOS resistor P21 is generated.

The shown resistor circuit includes the reference resistor circuit 1 having the reference MOS resistor P11, the variable resistor circuit 2 having the variable MOS resistor P21, a control circuit 3' controlling the gate voltages of the MOS resistors P11 and P21, the current source 5 for the reference resistor circuit 1, and the current source 11 for the variable resistor circuit 2.

The gate voltage $V_{gs\_p11}$ of the reference resistor circuit 1 is controlled by the control circuit 3' in order that the generated voltage is controlled to be the same as the reference voltage $V_{ref}$, that is, the resistance of the reference MOS resistor P11 is controlled to be constant. The resistor unit including the two identical resistors R11 and R12 connected in series is connected in parallel with the reference MOS resistor P11 between the drain and source thereof. A potential $V_{c\_p11}$ corresponding to half the drain-source voltage $V_{ds\_p11}$ can be obtained from the intermediate point 7 between the resistors R11 and R12 connected in series.

The variable resistor circuit 2 has a structure similar to that of the reference resistor circuit 1. The resistor unit including the two identical resistors R21 and R22 connected in series is connected in parallel with the variable MOS resistor P21 between the drain and source thereof. A potential $V_{c\_p21}$ corresponding to half the drain-source voltage $V_{ds\_p21}$ of the variable MOS resistor P21 can be obtained from the intermediate point 10 between the resistors R21 and R22 connected in series. The gate voltage $V_{gs\_p21}$ of the variable resistor circuit 2 is controlled by the control circuit 3' in order that the resistance $R_{P21}$ of the variable MOS resistor P21 is controlled to follow the resistance $R_{P11}$ of the reference MOS resistor P11.

The voltages $V_r$, $V_{c\_P11}$, and $V_{c\_P21}$, and the reference voltage $V_{ref}$ are input to the control circuit 3'. The voltage $V_r$ is generated at the reference MOS resistor P11 in the reference resistor circuit 1 and obtained from the detection point denoted by reference numeral 6. The voltage $V_{c\_P11}$, is half the drain-source voltage $V_{ds\_p11}$. The voltage $V_{c\_P21}$ is half the drain-source voltage $V_{ds\_p11}$. The reference voltage $V_{ref}$ is denoted by reference numeral 5. In addition, the control circuit 3' generates the control signals 8 and 9 for controlling the reference resistor circuit 1 and the variable resistor circuit 2, respectively.

The control circuit 3' is configured to control the gate voltage $V_{gs\_p11}$ such that the voltage $V_r$ generated at the reference MOS resistor P11 in the reference resistor circuit 1 is controlled to be the same as the reference voltage $V_{ref}$ (that is, the resistance of the reference MOS resistor p11 is controlled to be constant). The control circuit 3' is also configured to control the gate voltage $V_{gs\_p21}$ of the variable MOS resistor P21 in the variable resistor circuit 2 on the basis of the gate voltage $V_{gs\_p11}$ at the reference MOS resistor P11. In particular, half the drain-source voltage $V_{ds\_p11}$ of the reference MOS resistor P11 and half the drain-source voltage $V_{ds\_p21}$ of the variable MOS resistor P21 are detected, half the drain-source voltage $V_{ds\_p11}$ is subtracted from and half the drain-source voltage $V_{ds\_p21}$ is added to the gate voltage $V_{gs\_p11}$ of the reference MOS resistor P11, the resulting voltage is provided as the gate voltage $V_{gs\_p21}$ of the variable MOS resistor P21, and the resistance of the variable MOS resistor P21 is thereby controlled.

Figure 5:
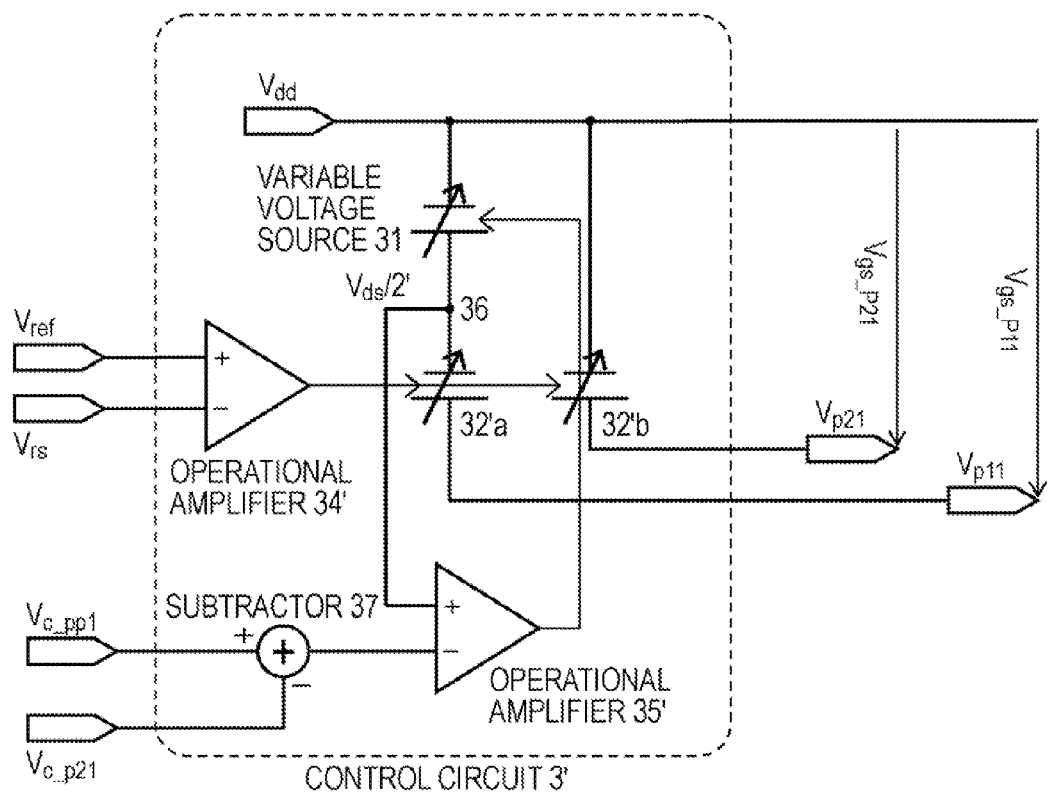
FIG. 5 is a block diagram showing an internal structure of a control circuit 3'.

FIG. 5 shows an internal configuration of the control circuit 3'. The voltage $V_r$ generated at the reference MOS resistor P11 in the reference resistor circuit 1 is compared with the reference voltage $V_{ref}$ at an operational amplifier 34', and the comparison result serves as a signal for controlling variable voltage sources 32'a and 32'b. The variable voltage sources 32'a and 32'b are identical variable voltage sources, and the same potential is generated across the ends of each of the variable voltage sources 32'a and 32'b.

A voltage $V_{ds}/2'$ generated at the variable voltage source 32' is obtained from the detection point 36 and input to one of input terminals of an operational amplifier 35'. A subtractor 37 subtracts the voltage $V_{c\_p21}$ corresponding to half the drain-source voltage $V_{ds\_p21}$ of the variable MOS resistor P21, the voltage $V_{c\_p21}$ being obtained from the detection point 10, from the voltage $V_{c\_p11}$ corresponding to half the drain-source voltage $V_{ds\_p11}$ of the reference MOS resistor P11, the voltage $V_{c\_p11}$ being obtained from the detection point 7. The subtractor 37 inputs the result to the other one of the input terminals of the operational amplifier 35'. The comparison result from the operational amplifier 35' serves as a signal for controlling the variable voltage source 31'. The signal controls the voltage $V_{ds}/2'$ generated at the variable voltage source 32' to be the same as the potential difference $(V_{c\_p11} - V_{c\_p21})$.

The control circuit 3' includes two output channels, one for the control signal 8 for the reference resistor circuit 1 and another for the control signal 9 for the variable resistor circuit 2. The potential Vp11 of the control signal 8 applied to the reference resistor circuit 1 is the sum of the potentials of the variable voltage sources 31 and 32a, and controls the gate voltage $V_{gs\_p11}$ of the reference MOS resistor P11 such that the voltage $V_{ds\_p11}$ generated in the reference resistor circuit 1 is controlled to be the same as the reference voltage (that is, the resistance of the reference resistor circuit 1 is controlled to be constant). The potential $V_{p21}$ of the control signal 9 input to the variable resistor circuit 2 is the voltage of the variable voltage source 32b. The potential $V_{p21}$ is a voltage obtained by subtracting half the drain-source voltage $V_{ds\_p11}$ from and adding half the drain-source voltage $V_{ds\_p21}$ of the variable MOS resistor P21 to the gate voltage $V_{gs\_p11}$ of the reference MOS resistor P11, and controls the gate voltage $V_{gs\_p21}$ of the variable MOS resistor P21.

Next, operations occurring in the resistor circuit shown in FIGS. 4 and 5 will be described.

A constant current I flows from the constant current source 5 to the reference resistor circuit 1. Here, the potential $V_r$ generated in the reference resistor circuit 1 is detected at the detection point 6 and input to the control circuit 3'. The reference voltage $V_{ref}$ denoted by reference numeral 5 is also input to the control circuit 3'.

The control circuit 3' controls the gate voltage $V_{ds\_p11}$ of the reference MOS resistor P11 in the reference resistor circuit 1 using the potential $V_{p11}$ of the control signal 8 such that the voltage $V_r$ generated in the reference resistor circuit 1 is controlled to be the same as the reference voltage $V_{ref}$, thereby changing the resistance $R_{p11}$ of the reference MOS resistor P11.

In addition, the control circuit 3' controls the gate voltage $V_{gs\_p21}$ of the variable MOS resistor P21 in the variable resistor circuit 2 using the potential $V_{p21}$ of the control signal 9, thereby changing the resistance $R_{P21}$. The resistance $R_{P21}$ is controlled so as to follow the resistance $R_{p11}$ of the reference MOS resistor P11 by the control circuit 3'.

Here, the potential $V_{p11}$ of the control signal 8 and the potential $V_{p21}$ of the control signal 9 will be described. The potential $V_{p11}$ corresponds to the gate voltage $V_{gs\_p11}$ of the reference MOS resistor P11. If the approximate expression $V_{ds} \ll 2(V_{gs} - V_{th})$ for resistors is not sufficiently satisfied at the reference MOS resistor P11, Eq. (9) given below is obtained for the gate voltage $V_{gs\_p11}$ on the basis of Eq. (4). Eq. (9) is the same as Eq. (5).

$$V_{gs\_p11} = \frac{1}{R_{P11}} \frac{1}{\mu C_{OX} \frac{W}{L}} + V_{th} + \frac{1}{2} V_{ds\_p11} \quad (9)$$

Eq. (9) shows that the gate voltage $V_{gs\_p11}$ as the potential $V_{p11}$ of the control signal 8 for resistor-adjustment depends on the drain-source voltage $V_{ds\_p11}$.

The following focuses on the variable resistor circuit 2. In order that the resistance $R_{P21}$ of the variable MOS resistor P21 is controlled to be the same as the resistance $R_{P11}$ of the reference MOS resistor P11, it is merely necessary that a control voltage be set to $\frac{1}{2}V_{ds\_p21}$ instead of $\frac{1}{2}V_{ds\_p11}$, which is the third term of the right hand side of Eq. (9). Therefore, the voltage $V_{p21}$ of the control signal 9, that is, the drain-source voltage $V_{ds\_p21}$ of the variable MOS resistor P21, is expressed by Eq. (10) given below.

$$V_{gs\_p21} = \frac{1}{R_{P21}} \frac{1}{\mu C_{OX} \frac{W}{L}} + V_{th} + \frac{1}{2} V_{ds\_p21} \quad (10)$$

From Eq. (10), it can be understood that it is not necessary for the drain-source voltage of the reference MOS resistor P11 and that of the variable MOS resistor P21 to be the same when the gate voltage $V_{gs\_p21}$ of the variable MOS resistor P12 is controlled with reference to the gate voltage $V_{ds\_p11}$ of the reference MOS resistor P11. In addition, since constraints related to approximate condition $V_{ds} << 2(V_{gs} - V_{th})$ for MOS resistors do not exist for the reference MOS resistor P11, the drain-source voltage $V_{ds\_p11}$ can be increased and the precision can be improved. A current from the constant current source for supplying the drain current $I_d$ to the MOS resistor can be decreased by increasing the drain-source voltage $V_{ds\_p11}$, and thereby power consumption can be reduced. Moreover, since the gate voltage $V_{gs}$ can be changed by a large amount, a variable resistance which can be varied over a wide range can be achieved.

The control circuit 3 shown in FIG. 5 has a structure which can generate the gate voltage $V_{gs\_p11}$ for the reference MOS resistor P11 and the gate voltage $V_{gs\_p21}$ for the variable MOS resistor P21.

The voltage $V_r$ generated at the reference resistor circuit 1 and obtained from the detection point 6 and the reference voltage $V_{ref}$ denoted by reference numeral 5 are each input to the operational amplifier 34'. The operational amplifier 34' controls the variable voltage sources 32'a and 32'b such that the generated voltage $V_r$ and the reference voltage $V_{ref}$ are controlled to be the same potential.

The voltage $V_{ds\_p11}/2'$ generated at the variable voltage source 31 is obtained from the detection point 36 and input to one of input terminals of the operational amplifier 35'. The $V_{c\_p11}$ obtained by halving the drain-source voltage $V_{ds\_p11}$ at the intermediate point 7 between the resistors R11 and R12 which are connected in parallel with the reference MOS resistor P11 and the $V_{c\_p11}$ obtained by halving the drain-source voltage $V_{ds\_p11}$ at the intermediate point 7 between the resistors R21 and R22 which are connected in parallel with the variable MOS resistor P21 are input to positive and negative terminals of the subtractor 37, respectively. The subtraction result is input to the other one of the terminals of the operational amplifier 35'. The operational amplifier 35' controls the variable voltage source 31 such that $V_{ds\_p11}/2'$ and $(V_{c\_p11} - V_{c\_p21})$ are controlled to be the same potential.

Here, the gate voltage $V_{gs\_p11}$ of the reference MOS resistor P11 is the sum of the potentials output from the two variable voltage sources 31 and 32a. The gate voltage $V_{gs\_p11}$ is expressed by Eq. (9). If the voltages of the variable voltage sources 31 and 32a are shown as $V_{31'}$ and $V_{32'a}$, respectively, the power supply voltages $V_{31'}$ and $V_{32'a}$ are expressed by Eq. (11) and Eq. (12) given below, respectively, since the variable voltage source 31' is controlled to be $V_{ds}/2$ and the variable voltage source 32'a is controlled such that $V_{ds\_p11}$ is expressed by Eq. (9).

$$V_{31'} = \frac{1}{2} V_{ds\_p11} - \frac{1}{2} V_{ds\_p21} \quad (11)$$

$$V_{32'a} = V_{gs\_p21} = V_{gs\_p11} - V_{31'} = \frac{1}{R_{P21}} \frac{1}{\mu C_{OX} \frac{W}{L}} + V_{th} + \frac{1}{2} V_{ds\_p21} \quad (12)$$

The variable voltage sources 32'a and 32'b are identical variable voltage sources. The same potential is generated across the ends of each of the variable voltage sources 32'a and 32'b. Therefore, the output voltage $V_{gs\_p21}$ is the same as that expressed by Eq. (10), and a control signal for the variable MOS resistor P21 can be generated.

Thus, the variable MOS resistor P21 can follow the resistance of the reference MOS resistor P11 for any given value of the drain-source voltage $V_{ds\_p11}$ of the reference MOS resistor P11. The gate voltage $V_{gs\_p21}$ of the variable MOS resistor P21 includes the voltage $\frac{1}{2}V_{ds\_p21}$ detected at the intermediate point between the drain and source. Therefore, even if the drain-source voltage $V_{ds\_p21}$ is not 0 V but varies, the variable MOS resistor P21 can follow the resistance of the reference MOS resistor P11.

Figure 6:
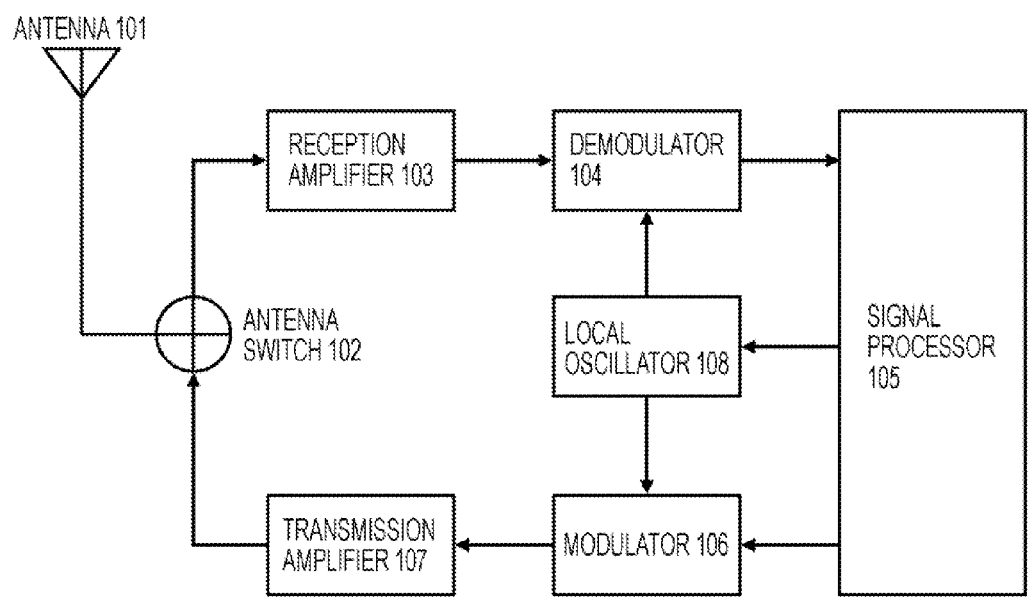
FIG. 6 is a diagram showing an exemplary hardware structure of a wireless communication apparatus.

A load circuit can be formed using resistor circuits shown in FIGS. 1 and 2 and FIGS. 4 and 5. Such a load circuit can be implemented as a load resistance within a transmission amplifier or a reception amplifier in a communication apparatus. FIG. 6 shows a hardware configuration of a wireless communication apparatus using a transmission amplifier and a reception amplifier that include a resistor circuit/circuits according to the present invention. The wireless communication apparatus includes a transmitter and a receiver. The communication apparatus will be described below.

A reception signal received from an antenna 101 is led to a reception amplifier 103 via an antenna switch 102. The reception amplifier 103 performs necessary processing such as bandwidth limiting and automatic gain control (AGC) in order that the reception signal is controlled to be of an appropriate power level. A demodulator 104 mixes outputs from a local oscillator 108 and a reception amplifier 103, that is, synthesizes a frequency of a signal from the local oscillator 108 and that of an output from the reception amplifier 103. Then, the demodulator 104 converts and demodulates the desired reception frequency into a certain frequency. The mixed and demodulated signal is converted from analog to digital and becomes digital data including I-axis and Q-axis signals each having a predetermined bit rate. Against the I-axis and Q-axis digital data, a signal processor 105 eliminates certain effects such as fading, detects a type of the reception signal, performs deinterleaving, and performs error correction. After appropriate decoding is performed, the signal processor 105 separates the decoded signal into communication-control data and communication body data.

Transmission data is encoded, the communication-control data is added to the transmission data, and the resulting data is divided into blocks suitable for a transmission burst signal at the transmitter. The transmission burst signal becomes the digital data including I-axis and Q-axis signals each having a predetermined bit rate at the signal processor 105. After quadrature modulation is performed on the signal at a modulator 106, the signal and a signal from the local oscillator 108 for conversion are mixed, that is, frequencies of the signals are synthesized, and converted into a desired transmission frequency. The converted signal with the desired frequency is amplified at a transmission amplifier 107 in order to have sufficient power for transmission. The amplified signal is emitted from the antenna 101 to a propagation path via a selector 202.

INDUSTRIAL APPLICABILITY

The present invention has been described in detail with reference to specific embodiments above. However, it is apparent that those skilled in the art may modify or substitute the embodiments within the scope of the invention.

For example, a resistor circuit according to the present invention can be employed to configure a load circuit. A differential amplifier circuit can be made by disposing such a load circuit as an output load between output terminals. Moreover, such a load circuit can be implemented as a load resistor within a transmission amplifier or a reception amplifier in a communication apparatus. As a matter of course, applications of the resistor circuit according to the present invention are not limited to those described above.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A resistor circuit comprising:
    a reference MOS resistor;
    a variable MOS resistor;
    first control means for controlling a gate voltage of the reference MOS resistor such that a resistance of the reference MOS resistor is controlled to be constant;
    voltage detection means for detecting half of a drain-source voltage of the reference MOS resistor; and
    second control means for controlling the variable resistor by supplying a gate voltage of the variable MOS resistor on the basis of the gate voltage of the reference MOS resistor controlled by the first control means and half the drain-source voltage of the reference MOS resistor detected by the voltage detection means.

2. The resistor circuit according to claim 1, wherein the first control means includes means for detecting a voltage generated in the reference MOS resistor and means for controlling the voltage generated in the reference MOS resistor to be the same as a predetermined reference voltage.

3. The resistor circuit according to claim 1, wherein the voltage detection means includes a resistor unit connected in parallel with the reference MOS resistor between a drain and source thereof, the resistor unit including two resistors having the same resistance connected in series, and wherein half the drain-source voltage of the reference MOS resistor is detected at an intermediate point of the resistor unit having the resistors connected in series.

4. The resistor circuit according to claim 1, wherein the reference MOS resistor and the variable MOS resistor are of a PMOS type or an nMOS type.

5. The resistor circuit according to claim 1 further comprising second voltage detection means for detecting half of a drain-source voltage of the variable MOS resistor,
    wherein the second control means controls the variable resistor by supplying a voltage as the gate voltage of the variable MOS resistor, the voltage being obtained by subtracting half the drain-source voltage of the reference MOS resistor detected by the voltage detection means from, and adding half the drain-source voltage of the variable MOS resistor detected by the second voltage detection means to, the gate voltage of the reference MOS resistor controlled by the first control means.

6. The resistor circuit according to claim 5, wherein the second voltage detection means includes a resistor unit connected in parallel with the variable MOS resistor between a drain and source thereof, the resistor unit including two resistors having the same resistance connected in series, and wherein half the drain-source voltage of the variable MOS resistor is detected at an intermediate point of the resistor unit having the resistors connected in series.

7. A load circuit comprising the variable MOS resistor according to claim 1.

8. A differential amplifier circuit, wherein the variable MOS resistor according to claim 1 is inserted as an output load between output terminals of the differential amplifier circuit.

9. A communication apparatus, wherein the variable MOS resistor according to claim 1 is implemented as a load resistor within at least one of a transmission amplifier and a reception amplifier.

* * * * *